(12) United States Patent
Lill et al.

(10) Patent No.: US 9,779,955 B2
(45) Date of Patent: Oct. 3, 2017

(54) ION BEAM ETCHING UTILIZING CRYOGENIC WAFER TEMPERATURES

(71) Applicant: Lam Research Corporation, Fremont, CA (US)

(72) Inventors: Thorsten Lill, Santa Clara, CA (US); Ivan L. Berry, III, San Jose, CA (US); Anthony Ricci, Redwood City, CA (US)

(73) Assignee: Lam Research Corporation, Fremont, CA (US)

( * ) Notice: Subject to any disclaimer, the term of this patent is extended or adjusted under 35 U.S.C. 154(b) by 52 days.

(21) Appl. No.: 15/054,023

(22) Filed: Feb. 25, 2016

(65) Prior Publication Data

US 2017/0250087 A1 Aug. 31, 2017

(51) Int. Cl.
*H01L 21/311* (2006.01)
*H01L 21/3065* (2006.01)
(Continued)

(52) U.S. Cl.
CPC .... *H01L 21/3065* (2013.01); *H01L 21/67213* (2013.01); *H01L 27/222* (2013.01); *H01L 43/08* (2013.01)

(58) Field of Classification Search
CPC ........... H01L 21/3065; H01L 21/67213; H01L 27/222; H01L 43/08; H01L 43/12
(Continued)

(56) References Cited

U.S. PATENT DOCUMENTS 3,704,511 A 12/1972 Hooker
3,899,711 A 8/1975 Lemmond
(Continued)

FOREIGN PATENT DOCUMENTS

CA 1157511 11/1983
CA 1184239 3/1985
(Continued)

OTHER PUBLICATIONS

U.S. Appl. No. 14/473,863, filed Aug. 29, 2014, entitled "Ion Injector and Lens System for Ion Beam Milling."
(Continued)

*Primary Examiner* — Binh X Tran
(74) *Attorney, Agent, or Firm* — Weaver Austin Villeneuve & Sampson LLP (57) ABSTRACT

The embodiments herein relate to methods and apparatus for etching features in semiconductor substrates. In a number of cases, the features may be etched while forming a spin-torque-transfer random access memory (STT-RAM) device. In various embodiments, the substrate may be cooled to a low temperature via a cooled substrate support during particular processing steps. The cooled substrate support may have beneficial impacts in terms of reducing the degree of diffusion-related damage in a resulting device. Further, the use of a non-cooled substrate support during certain other processing steps can likewise have beneficial impacts in terms of reducing diffusion-related damage, depending on the particular step. In some implementations, the cooled substrate support may be used in a process to preferentially deposit a material (in some cases a reactant) on certain portions of the substrate. The disclosed embodiments may be used to achieve high quality anisotropic etching results.

18 Claims, 6 Drawing Sheets

(51) Int. Cl.
  *H01L 21/67* (2006.01)
  *H01L 27/22* (2006.01)
  *H01L 43/08* (2006.01)

(58) Field of Classification Search
  USPC .................. 438/695, 696; 216/22, 66, 75
  See application file for complete search history.

(56) References Cited

U.S. PATENT DOCUMENTS

| | | | |
|---|---|---|---|
| 4,200,794 | A | 4/1980 | Newberry et al. |
| 4,419,580 | A | 12/1983 | Walker et al. |
| 4,873,445 | A | 10/1989 | Le Jeune |
| 5,284,544 | A | 2/1994 | Mizutani et al. |
| 6,617,595 | B1 | 9/2003 | Okunuki |
| 7,037,846 | B2 | 5/2006 | Srivastava et al. |
| 7,416,989 | B1 | 8/2008 | Liu et al. |
| 7,977,249 | B1 | 7/2011 | Liu et al. |
| 7,981,763 | B1 | 7/2011 | van Schravendijk et al. |
| 8,058,179 | B1 | 11/2011 | Draeger et al. |
| 8,187,486 | B1 | 5/2012 | Liu et al. |
| 8,608,973 | B1 | 12/2013 | Guha |
| 8,617,411 | B2 | 12/2013 | Singh |
| 9,406,535 | B2 | 8/2016 | Berry, III et al. |
| 9,536,748 | B2 | 1/2017 | Berry, III et al. |
| 2003/0168588 | A1 | 9/2003 | Brailove et al. |
| 2005/0199822 | A1 | 9/2005 | Saini et al. |
| 2005/0211926 | A1 | 9/2005 | Ito et al. |
| 2006/0192104 | A1 | 8/2006 | Schultz et al. |
| 2007/0063337 | A1 | 3/2007 | Schubert et al. |
| 2007/0068624 | A1 | 3/2007 | Jeon et al. |
| 2007/0181820 | A1 | 8/2007 | Hwang et al. |
| 2008/0132046 | A1 | 6/2008 | Walther |
| 2008/0179186 | A1 | 7/2008 | Shimura et al. |
| 2011/0100954 | A1 | 5/2011 | Satake et al. |
| 2012/0288799 | A1 | 11/2012 | Takase et al. |
| 2013/0216959 | A1 | 8/2013 | Tanaka et al. |
| 2014/0021343 | A1 | 1/2014 | Kirkpatrick et al. |
| 2014/0076716 | A1 | 3/2014 | Gorokhovsky et al. |
| 2014/0356985 | A1 | 12/2014 | Ricci et al. |
| 2015/0179393 | A1 | 6/2015 | Colvin et al. |
| 2015/0287911 | A1* | 10/2015 | Kim ..................... H01L 27/228 438/3 |
| 2015/0311292 | A1 | 10/2015 | Srinivasan et al. |
| 2016/0035972 | A1* | 2/2016 | Lee ..................... G11C 13/0004 438/3 |
| 2016/0049281 | A1 | 2/2016 | Berry, III et al. |
| 2016/0064232 | A1 | 3/2016 | Berry, III et al. |
| 2016/0064260 | A1 | 3/2016 | Berry, III et al. |
| 2016/0111294 | A1 | 4/2016 | Berry, III et al. |
| 2016/0307781 | A1 | 10/2016 | Berry, III et al. |
| 2016/0308112 | A1* | 10/2016 | Tan ..................... H01L 27/222 |
| 2016/0351798 | A1* | 12/2016 | Shen ..................... H01L 43/12 |
| 2017/0047510 | A1* | 2/2017 | Chen ..................... H01L 43/08 |
| 2017/0062181 | A1 | 3/2017 | Berry, III et al. |
| 2017/0148976 | A1* | 5/2017 | Annunziata ............ H01L 43/02 |

FOREIGN PATENT DOCUMENTS

| | | |
|---|---|---|
| CN | 1661762 A | 8/2005 |
| JP | 06-208837 A | 7/1994 |
| KR | 10-2011-0097193 A | 8/2011 |
| WO | WO 2013/012620 | 1/2013 |

OTHER PUBLICATIONS

U.S. Appl. No. 14/458,161, filed Aug. 12, 2014, entitled "Differentially Pumped Reactive Gas Injector."
U.S. Appl. No. 14/520,070, filed Oct. 21, 2014, entitled "Use of Ion Beam Etching to Generate Gate-All-Around Structure."
U.S. Appl. No. 14/592,820, filed Jan. 8, 2015, entitled "Ion Beam Etch Without Need for Wafer Tilt or Rotation."
U.S. Appl. No. 13/908,676, filed Jun. 3, 2013, entitled "Temperature Controlled Substrate Support Assembly."
U.S. Notice of Allowance, dated Jun. 20, 2016, issued in U.S. Appl. No. 14/473,863.
U.S. Office Action, dated Feb. 17, 2016, issued in U.S. Appl. No. 14/520,070.
U.S. Final Office Action, dated Jun. 28, 2016, issued in U.S. Appl. No. 14/520,070.
U.S. Notice of Allowance, dated Aug. 17, 2016, issued in U.S. Appl. No. 14/520,070.
U.S. Notice of Allowance, dated Nov. 23, 2016, issued in U.S. Appl. No. 14/520,070.
U.S. Office Action, dated Jun. 14, 2016, issued in U.S. Appl. No. 14/592,820.
U.S. Final Office Action, dated Nov. 28, 2016, issued in U.S. Appl. No. 14/592,820.
Chinese First Office Action dated Nov. 2, 2016 issued in Application No. CN 201510548855.2.
Engelhardt et al. (1988) "Deep Trench Etching Using $CBrF_3$ and $CBrF_3$/Chlorine Gas Mixtures," *Siemens AG*, Otto-Hahn-Ring, 8000 Munich 83, Germany, pp. 48-54.
Matsuo (May 1, 1980) "Selective etching of Si relative to $SiO_2$ without undercutting by $CBrF_3$ plasma," *Applied Physics Letters*, 36(9):768-770.
Ohiwa et al. (1990) "SiO2 Tapered Etching Employing Magnetron Discharge," *1990 Dry Process Symposium*, ULSI Research Center, Toshiba Corp., V-3, pp. 105-109.
Ohiwa et al. (Feb. 1992) "SiO2 Tapered Etching Employing Magnetron Discharge of Fluorocarbon Gas," *Jpn. J. Appl. Phys.*, 31(Part 1, 2A):405-410.
U.S. Appl. No. 15/475,021, filed Mar. 30, 2017, Hudson et al.
U.S. Office Action, dated Jul. 27, 2017, issued in U.S. Appl. No. 15/191,176.
U.S. Appl. No. 15/682,369, filed Aug. 22, 2017, Lill et al.

* cited by examiner

ION BEAM ETCHING UTILIZING CRYOGENIC WAFER TEMPERATURES

BACKGROUND

Fabrication of semiconductor devices typically involves a series of operations in which various materials are deposited onto and removed from a semiconductor substrate. One technique for material removal is ion beam etching, which involves delivering ions to the surface of a substrate to physically and/or chemically remove atoms and compounds from the surface in an anisotropic manner. The impinging ions strike the substrate surface and remove material through momentum transfer (and through reaction in the case of reactive ion etching).

SUMMARY

Certain embodiments herein relate to methods and apparatus for etching a substrate. Often, the etching occurs in the context of forming a spin-torque-transfer random access memory (STT-RAM) device. In various cases, a cooled substrate support is used during particular processing steps, which may reduce the degree of diffusion-related damage that occurs, thereby enabling manufacture of high quality STT-RAM devices.

In one aspect of the disclosed embodiments, a method of etching a substrate for forming a spin-torque-transfer random access memory (STT-RAM) device is provided, the method including: receiving the substrate in a reaction chamber, the substrate including (i) a bottom electrode layer, (ii) an etch stop layer positioned over the bottom electrode layer, (iii) a first magnetic layer positioned over the etch stop layer, (iv) a tunneling dielectric layer positioned over the first magnetic layer, (v) a second magnetic layer positioned over the tunneling dielectric layer, and (vi) a patterned mask layer; performing a first ion beam etching operation to define features on the substrate, the first ion beam etching operation including exposing the substrate to ion beams to etch through at least the second magnetic layer, the tunneling dielectric layer, and the first magnetic layer, and where during the first ion beam etching operation, a substrate support is maintained at a temperature between about 10° C. and about 120° C.; performing a second ion beam etching operation to narrow the features on the substrate, the second ion beam etching operation including exposing sidewalls of the features to ion beams, where the second ion beam etching operation is performed at a lower ion energy than the first ion beam etching operation, and where the first and/or second ion beam etching operation result in formation of conductive material on exposed portions of the tunneling dielectric layer and/or in the tunneling dielectric layer; and performing a conductive material mitigation operation to mitigate the conductive material formed on or in the tunneling dielectric layer during the first and/or second ion beam etching operation, where mitigating the conductive material includes either removing the conductive material or rendering the conductive material less conductive, where the conductive material mitigation operation includes exposing the substrate to ion beams, where the conductive material mitigation operation is performed at a lower ion energy than the second ion beam etching operation, and where during the conductive material mitigation operation, the substrate support is maintained at a temperature between about −70° C. and about −10° C.

In some embodiments, the substrate support temperature may be changed during an operation. In one example, during the second ion beam etching operation, the substrate support temperature is lowered by at least about 20° C. The substrate support may be maintained at a temperature between about 10° C. and about 120° C. during the second ion beam etching operation.

During the conductive material mitigation operation, the ion beams may include oxygen ions and inert ions. In some other cases, during the conductive material mitigation operation, the ion beams may include inert ions without any reactive ions. In some embodiments, during the conductive material mitigation operation, the ion beams include inert ions and one or more reactant selected from the group consisting of: $O_2$, $CO$, $CO_2$, $N_2$, and combinations thereof.

Specific ion energies may be used in some cases. For example, in one embodiment the ion energy during the first ion beam etching operation may be between about 100-10,000 eV (in some cases between about 100-1000 eV), the ion energy during the second ion beam etching operation may be between about 50-300 eV, and the ion energy during the conductive material mitigation operation may be between about 10-100 eV. In certain implementations, the method may further include after the first ion beam etching operation and before the second ion beam etching operation, altering a relative orientation between the substrate and a direction in which the ion beams travel.

In another aspect of the disclosed embodiments, a method of etching a substrate for forming a STT-RAM device is provided, the method including: receiving the substrate in a reaction chamber, the substrate including (i) a bottom electrode layer, (ii) an etch stop layer positioned over the bottom electrode layer, (iii) a first magnetic layer positioned over the etch stop layer, (iv) a tunneling dielectric layer positioned over the first magnetic layer, (v) a second magnetic layer positioned over the tunneling dielectric layer, and (vi) a patterned mask layer; performing a first ion beam etching operation to define features on the substrate, the first ion beam etching operation including exposing the substrate to ion beams to etch through at least the second magnetic layer, the tunneling dielectric layer, and the first magnetic layer, and where during the first ion beam etching operation, a substrate support is maintained at a temperature between about 10° C. and about 120° C.; performing a second ion beam etching operation to narrow the features on the substrate, the second ion beam etching operation including exposing sidewalls of the features to ion beams and preferentially depositing a first material in regions etched during the first ion beam etching operation, and where during the second ion beam etching operation, the substrate support is maintained at a temperature between about −70° C. and about 10° C.

In some embodiments the first material has particular properties. For example, in some cases (a) the first material is non-conductive, and/or (b) the first material, when combined with (i) a material of the bottom electrode layer, and/or (ii) a material of the first or second magnetic layer, is non-conductive. The first material may include one or more materials selected from the group consisting of: carbon, $SiO_2$, $SiN$, $SiC$, $SiCO$, $SiCN$, and combinations thereof. The method may further include, during the second ion beam etching operation, sputtering the first material onto the sidewalls of the features.

The first material may be an etching reactant in some cases. The etching reactant may include a halide-containing compound and/or a metalorganic compound. In some such cases, during the second ion beam etching operation, the sidewalls of the features may be exposed to the ion beams while the first material is deposited in the regions etched during the first ion beam etching operation. In some other cases, the second ion beam etching operation may include cyclically (a) depositing the first material and (b) exposing the substrate to the ion beams, where (a) and (b) do not overlap in time.

The method may further include after the first ion beam etching operation, altering a relative orientation between the substrate and a direction in which the ion beams travel. In some cases, this may involve tilting the substrate.

In a further aspect of the disclosed embodiments, an ion beam etching apparatus for etching a substrate while forming a STT-RAM device is provided, the apparatus including: a reaction chamber; an ion beam generator; a substrate support configured to heat and cool a substrate; a controller having instructions to etch the substrate by: receiving the substrate in the reaction chamber, the substrate including (i) a bottom electrode layer, (ii) an etch stop layer positioned over the bottom electrode layer, (iii) a first magnetic layer positioned over the etch stop layer, (iv) a tunneling dielectric layer positioned over the first magnetic layer, (v) a second magnetic layer positioned over the tunneling dielectric layer, and (vi) a patterned mask layer; performing a first ion beam etching operation to define features on the substrate, the first ion beam etching operation including exposing the substrate to ion beams to etch through at least the second magnetic layer, the tunneling dielectric layer, and the first magnetic layer, and where during the first ion beam etching operation, a substrate support is maintained at a temperature between about 10° C. and about 120° C.; performing a second ion beam etching operation to narrow the features on the substrate, the second ion beam etching operation including exposing sidewalls of the features to ion beams, where the second ion beam etching operation is performed at a lower ion energy than the first ion beam etching operation, and where the first and/or second ion beam etching operation result in formation of conductive material on exposed portions of the tunneling dielectric layer and/or in the tunneling dielectric layer; and performing a conductive material mitigation operation to mitigate the conductive material formed on or in the tunneling dielectric layer during the first and/or second ion beam etching operation, where mitigating the conductive material includes either removing the conductive material or rendering the conductive material less conductive, where the conductive material mitigation operation includes exposing the substrate to ion beams, where the conductive material mitigation operation is performed at a lower ion energy than the second ion beam etching operation, and where during the conductive material mitigation operation, the substrate support is maintained at a temperature between about −70° C. and −10° C.

In yet another aspect of the disclosed embodiments, an ion beam etching apparatus for etching a substrate while forming a STT-RAM device is provided, the apparatus including: a reaction chamber; an ion beam generator; a substrate support configured to heat and cool a substrate; a controller having instructions to etch the substrate by: receiving the substrate in a reaction chamber, the substrate including (i) a bottom electrode layer, (ii) an etch stop layer positioned over the bottom electrode layer, (iii) a first magnetic layer positioned over the etch stop layer, (iv) a tunneling dielectric layer positioned over the first magnetic layer, (v) a second magnetic layer positioned over the tunneling dielectric layer, and (vi) a patterned mask layer; performing a first ion beam etching operation to define features on the substrate, the first ion beam etching operation including exposing the substrate to ion beams to etch through at least the second magnetic layer, the tunneling dielectric layer, and the first magnetic layer, and where during the first ion beam etching operation, a substrate support is maintained at a temperature between about 10° C. and about 120° C.; performing a second ion beam etching operation to narrow the features on the substrate, the second ion beam etching operation including exposing sidewalls of the features to ion beams and preferentially depositing a first material in regions etched during the first ion beam etching operation, and where during the second ion beam etching operation, the substrate support is maintained at a temperature between about −70° C. and about −10° C.

These and other features will be described below with reference to the associated drawings.

DETAILED DESCRIPTION

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the embodiments are implemented on a wafer. However, the embodiments are not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Ion beam etching is commonly used in fabrication of magnetic devices. As mentioned above, ion beam etching involves removing material from the surface of a substrate by delivering energetic ions to the substrate surface. Ion beam etching may be broadly categorized into processes that solely involve inert ions (e.g., argon ions, helium ions, etc.), and processes that involve reactive ions or chemical reactions initiated by ions (e.g., oxygen ions, certain ionized compounds such as fluorine-containing ionized compounds, reactive or inert ions initiating a chemical reaction with a reactant chemisorbed or physisorbed on the surface on the substrate, etc.). In these of processes, ions impinge on the substrate surface and remove material through either direct physical momentum transfer (sputtering) or a chemical reaction initiated by the energy transfer from the ions (reactive ion beam etching or chemically assisted ion beam etching). Reactive ion beam etching (RIBE) typically involves utilization of an ion that can chemically react with the substrate (such as oxygen, fluorine and the like). In chemically assisted ion beam etching (CAME), an inert ion either initiates a chemical reaction between the substrate and a reactant (such as an applied gas that is adsorbed on the surface), or generates a reactive site on the surface of the substrate that reacts with an applied reactant coincident with or subsequent to the generation of the reactant site, or any combination thereof.

Certain applications for ion beam etching processes relate to etching of non-volatile materials. In some cases, the material etched is a conductive material. In certain embodiments, the material is etched in the context of forming a magnetoresistive random-access memory (MRAM) device, for example a spin-torque-transfer memory device (STT-RAM). Various methods and apparatus described herein may also be useful in the context of forming a phase-change memory device (PSM), a non-volatile conductor (copper, platinum, gold, and the like), a vertically stacked memory device, etc.

Figure 1:
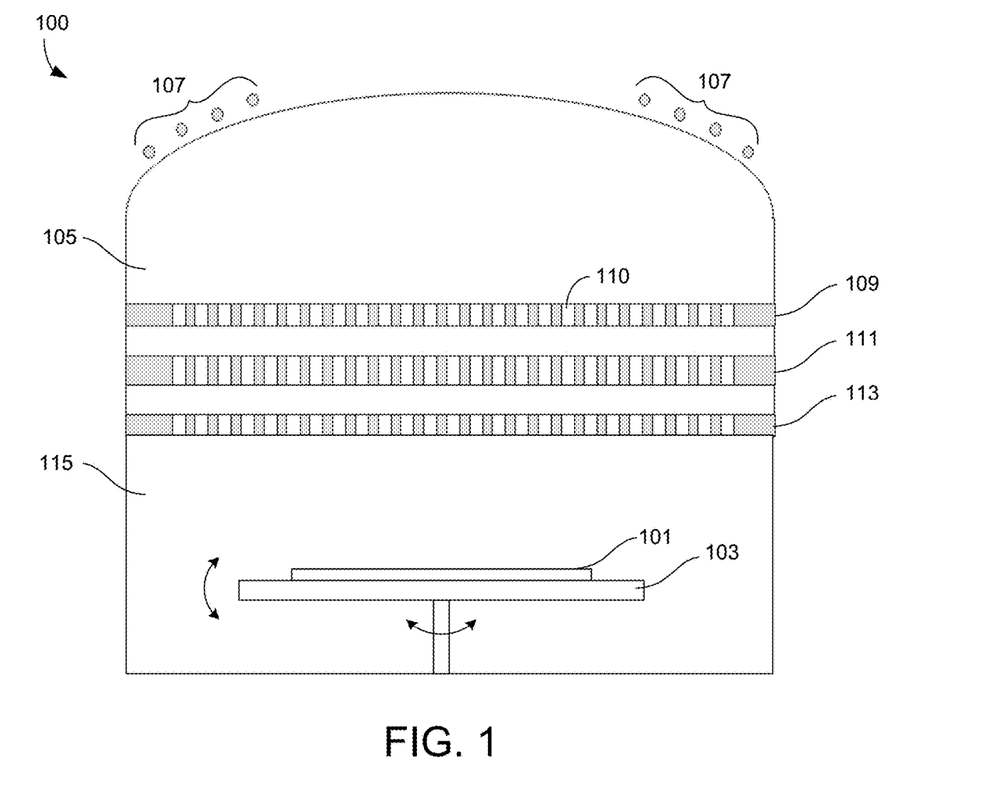
FIG. 1 illustrates a simplified view of a reaction chamber that may be used to practice certain embodiments.

FIG. 1 presents a simplified cross-sectional view of an apparatus 100 for performing ion beam etching according to certain methods. In this example, substrate 101 rests on substrate support 103, which may be equipped with hardware (not shown) to provide electrical and fluidic connections. The electrical connections may be used to supply electricity to the substrate support 103 or to an electrostatic chuck located on or within the substrate support 103 (not shown) in some cases, while the fluidic connections may be used to provide fluids used to control the temperature of the substrate 101 and substrate support 103. The substrate support 103 may be heated by a heater (not shown) and/or cooled by a cooling mechanism (not shown). Any appropriate cooling mechanism may be used. In one example, the cooling mechanism may involve flowing cooling fluids through piping in or adjacent the substrate support 103. In another example, the cooling mechanism may involve circulation within the substrate support of single or mixed refrigerants at cryogenic temperatures. In another example, the cooling mechanism may involve a plurality of Peltier devices that may be incorporated into or next to the substrate support 103. One example substrate support having a plurality of Peltier devices therein for cooling and/or heating the substrate is further discussed in relation to FIG. 4, below. In another example, the substrate support may include one or more cryostats therein or thereon to achieve cooling. Temperature controlled substrate supports are further described in U.S. patent application Ser. No. 13/908,676, filed Jun. 3, 2013, and titled "TEMPERATURE CONTROLLED SUBSTRATE SUPPORT ASSEMBLY," which is herein incorporated by reference in its entirety. The substrate support 103 may be capable of rotating and tilting at variable speeds and angles, as indicated by the double headed arrows in FIG. 1.

A plasma generation gas is delivered to a primary plasma generation region 105. The plasma generation gas is energized by a plasma source 107. In the context of FIG. 1, the plasma source 107 is a coil that acts as an inductively coupled plasma source. Other sources such as capacitively coupled sources, microwave sources or discharge sources may be employed in appropriately designed reactors. Plasma forms in the primary plasma generation region 105. An extraction electrode 109 includes a series of apertures 110 through which ions are extracted.

The apertures 110 may have a diameter between about 0.5-1 cm, and a height that is defined by the thickness of the electrode. The apertures 110 may have a height to width aspect ratio (AR) between about 0.01-100.0. In some cases the apertures 110 are arranged in a hexagonal, square grid, or spiral pattern, though other patterns may be used as well. A center-to-center distance between neighboring apertures may be between about 1 mm-10 cm. The apertures may be configured to achieve an overall open area (i.e., sum of the area of each aperture) that is between about 0.1%-95% of the surface area of the electrode when considering only a single (top or bottom) face of the electrode. For example, an electrode having a diameter of 40 cm and 500 holes each having a diameter of 1 cm will have an open area of about 31% (393 $cm^2$ open area divided by 1257 $cm^2$ total area). The apertures 110 may have different diameters in different electrodes. In some cases, the aperture diameter is smaller in upper electrodes and larger in lower electrodes. In one embodiment, the apertures in a lower electrode 113 are larger than the apertures in a focus electrode 111 (e.g., between about 0-30% larger). In these or other cases, the apertures in the focus electrode 111 are larger than the apertures in the extraction electrode 109 (e.g., between about 0-30% larger).

The bias $V_1$ applied to the extraction electrode 109 with respect to the substrate 101 acts to provide kinetic energy to the ion with respect to the substrate. This bias is generally positive and can range between about 20-10,000 volts or more. In certain cases the bias on the extraction electrode is between about 20-2,000 volts. Positive ions in the plasma above extraction electrode 109 are attracted to the lower electrode 113 by the potential difference between electrodes 109 and 113. Focus electrode 111 is added to focus the ions, and if needed, repel electrons. A bias $V_2$ on this electrode can be either positive or negative with respect to the extraction electrode 109, but is generally biased negatively. The bias potential of focus electrode 111 is determined by the lensing characteristics of the focus electrode 111. Bias voltages on the focus electrode include positive voltages between about 1.1× to 20× the potential $V_1$ on the extraction electrode, and negative voltages having a magnitude between about 0.001× to 0.95× the potential of $V_1$. Due to the different potentials applied to the different electrodes, a potential gradient exists. The potential gradient may be on the order of about 1000 V/cm. Example separation distances between neighboring electrodes fall between about 0.1-10 cm, or for example about 1 cm.

After the ions leave the bottom of the grounded lower electrode 113, they travel in a collimated and focused beam if the focus electrode 111 voltage is set to produce a collimated beam. Alternatively the beam can be made divergent if the focus electrode voltage is adjusted to either under- or over-focus the ion beam. The lower electrode 113 is grounded in many (but not all) cases. The use of a grounded lower electrode 113 in combination with a grounded substrate 101 results in a substrate processing region 115 that is substantially field free. Having the substrate located in a field-free region prevents electrons or secondary ions generated by collisions between the ion beam with residual gases or with surfaces in the reaction chamber from being accelerated towards the substrate, thereby minimizing the risk of causing unwanted damage or secondary reactions.

Additionally, it is important to prevent the substrate 101 from charging from the ion beam itself, or from ejected secondary electrons generated during the ion beam collision with the substrate. Neutralization is typically accomplished by adding a low energy electron source (not shown) in the vicinity of the substrate 101. Since the positive charge on the ion and the ejected secondary electrons both charge the substrate positively, low energy electrons in the vicinity of the substrate can be attracted to the positively charged surface and can neutralize this charge. Performing this neutralization is much easier in a field free region.

In some applications it may be desirable to have a potential difference between the lower electrode 113 and substrate 101. For example, if very low energy ions are required, it is difficult to maintain a well-collimated beam at low energy over long distances due to mutual repulsion of the positively charged ions (space-charge effects). One solution to this is to place a negative bias on the lower electrode 113 with respect to substrate 101 (or conversely biasing substrate 101 positively with respect to the lower electrode 113). This allows extracting the ions at higher energy, then slowing them down as they approach the substrate.

In certain ion beam etching operations, one of the three electrodes may be omitted. Where this is the case, there is less flexibility regarding the energy at which ions are directed to the surface of the substrate. This limitation arises because in order for the ions to be focused and directed as desired, a particular ratio of bias potentials should be applied to the two electrodes. The ratio of bias potentials is controlled by the focusing characteristics and geometries of the two electrodes. As such, where a particular geometry is used and a particular bias/electrical state is desired on the lower electrode (e.g., grounded), there is little or no flexibility in the bias applied to the upper electrode. The result is that a reaction chamber using such a setup is limited in the range of ion energy that may be imparted to ions as they travel through the various electrodes. The introduction of a third electrode allows the ions to be focused/directed as desired at many different ion energies, as described above.

Each of the electrodes 109, 111, and 113 has a thickness, which may be between about 0.5 mm-10 cm, or between about 1 mm-3 cm, for example about 5 mm. The electrodes 109, 111, and 113 may each be the same thickness, or they may have different thicknesses. Further, the separation distance between the extraction electrode 109 and the focus electrode 111 may be the same, greater, or less than the separation distance between the focus electrode 111 and the lower electrode 113. Each electrode 109, 111, and 113 also has dimensions, which may be less than, equal to or greater than the dimensions of the substrate being processed. In certain embodiments, the electrodes' dimensions are close to that of the substrate or substrate support (e.g., within about 50%).

The electrodes 109, 111, and 113, may be circular, rectangular or other polygonal shape. In certain embodiments the electrodes are long and narrow, wherein the long dimension is approximately equal to or greater than one dimension of the substrate, and the substrate is scanned in the orthogonal direction such that the ion beam strikes uniformly across the substrate surface when averaged over time.

The apertures 110 in the extraction electrode 109, focus electrode 111 and lower electrode 113 may be precisely aligned with one another. Otherwise, ions will be aimed incorrectly, and the on-wafer etching results will be poor. For instance, if a single aperture in the focus electrode 111 is misaligned, it may result in one area of the substrate 101 becoming over-etched (where too many ions are directed) and another area of the substrate 101 becoming under-etched (where no ions or too few ions are directed). As such, it is desirable for the apertures to be as aligned with one another as much as possible. In various cases the misalignment between vertically adjacent electrodes is limited to about 1% or less of the hole diameter (as measured by the distance of a linear shift in the position of the aperture as compared to the adjacent aperture).

In certain embodiments, a fourth electrode (not shown) may be provided, for example above the extraction electrode 109. The fourth electrode may be a hollow cathode emitter electrode. In other words, the fourth electrode may have a plurality of apertures that align with the apertures in the other electrodes 109, 111, and 113. Each of the apertures in the hollow cathode emitter electrode may be configured as a hollow cathode emitter. To this end, the hollow cathode emitter electrode may have an upper surface and a lower surface, the lower surface facing the extraction electrode 109. The plurality of apertures in the hollow cathode emitter electrode may be formed such that each aperture has a diameter that is larger at the upper surface and smaller toward the lower surface. The hollow cathode emitters of the hollow cathode emitter electrode may have various shapes. In certain cases, the apertures in the hollow cathode emitter electrode include a lower cylindrical portion and an upper variable diameter portion. The upper variable diameter portion may have a funnel shape. In certain similar embodiments, the extraction electrode 109 may be fabricated as a hollow cathode emitter electrode having any of the properties described with respect to the hollow cathode emitter electrode.

Further, in some embodiments, a set of reflectors (not shown) may be included, for example below the lower electrode 113. The reflectors may have an angle $\alpha$ with respect to the surface normal of lower electrode 113 between about 0.5-20°. The length of the reflectors may be sufficiently long to close off the apertures from a line-of-sight projection through the aperture holes onto the substrate. Therefore, the length of the reflectors may be greater than or equal to the diameter of the apertures in the lower electrode 113 divided by the sine of $\alpha$. The spacing between adjacent reflectors may be the same as the spacing between adjacent apertures. The reflectors may be positioned parallel to one another such that they uniformly alter the ion trajectories. Because the reflectors change the trajectory of the ions/particles as they enter the substrate processing region 115, the particles leaving the reflector do not travel straight downward. If it is desired that the particles impact the wafer 101 at a normal angle (i.e., 90°), the wafer 101 may be tilted to accommodate the angled trajectory of the particles. Tilting may be done by controlling the substrate support pedestal 103. In some cases, the wafer may be tilted and untilted to various degrees during etching to direct the ions/particles as needed. In other cases the electrode assembly may be tilted with respect to the substrate. Tilting may help achieve good etching results at feature sidewalls, for example. Such tilting may occur regardless of whether a reflector is used.

Ion beam etching processes are typically run at low pressures. In some embodiments, the pressure may be about 100 mTorr or less, for example about 1 mTorr or less, and in many cases about 0.1 mTorr or less. The low pressure helps minimize undesirable collisions between ions and any gaseous species present in the substrate processing region. In certain cases, a relatively high pressure reactant is delivered in an otherwise low pressure ion processing environment. Apparatus for achieving such processing methods are described in the following U.S. Patent Applications, each of which is herein incorporated by reference in its entirety: U.S. patent application Ser. No. 14/458,161, filed Aug. 12, 2014, and titled "DIFFERENTIALLY PUMPED REACTIVE GAS INJECTOR"; and U.S. patent application Ser. No. 14/473,863, filed Aug. 29, 2014, and titled "ION INJECTOR AND LENS SYSTEM FOR ION BEAM MILLING."

Ion beam etching processes may be used for atomic layer etching processes in some embodiments. Atomic layer etching methods are further discussed in the following U.S. Patents, each of which is herein incorporated by reference in its entirety: U.S. Pat. No. 7,416,989, titled "ADSORPTION BASED MATERIAL REMOVAL PROCESS"; U.S. Pat. No. 7,977,249, titled "METHODS OF REMOVING SILICON NITRIDE AND OTHER MATERIALS DURING FABRICATION OF CONTACTS"; U.S. Pat. No. 8,187,486, titled "MODULATING ETCH SELECTIVITY AND ETCH RATE OF SILICON NITRIDE THIN FILMS"; U.S. Pat. No. 7,981,763, titled "ATOMIC LAYER REMOVAL FOR HIGH ASPECT RATIO GAPFILL"; and U.S. Pat. No. 8,058,179, titled "ATOMIC LAYER REMOVAL PROCESS WITH HIGHER ETCH AMOUNT."

Figure 2A:
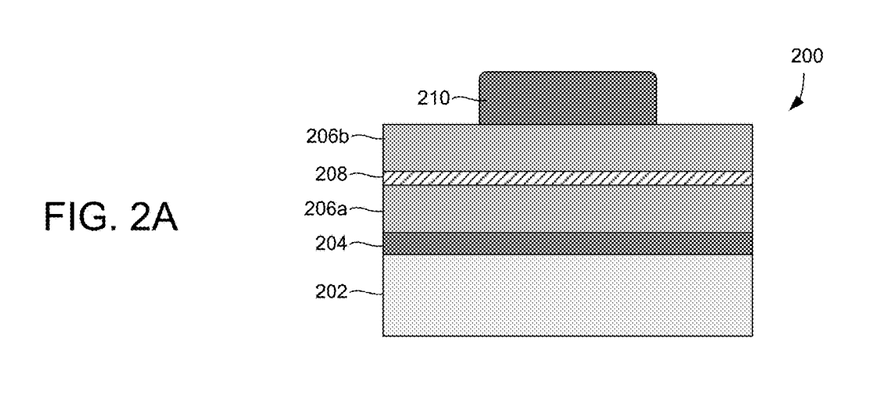
FIGS. 2A-2C depict a partially fabricated semiconductor substrate at different points in time during an etching process.
Figure 2B:
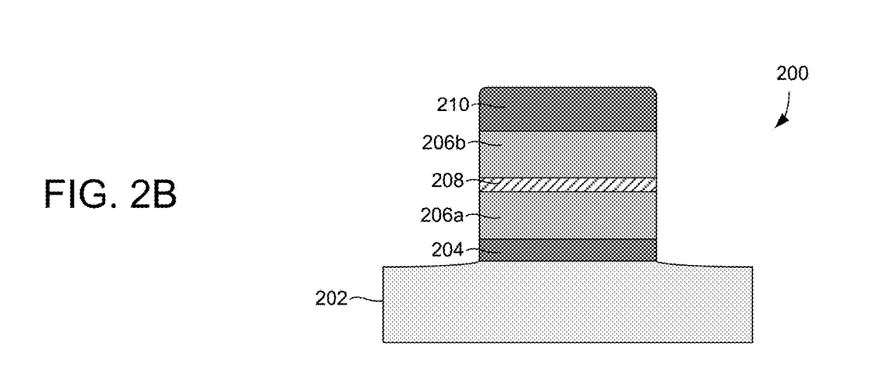
Figure 2C:
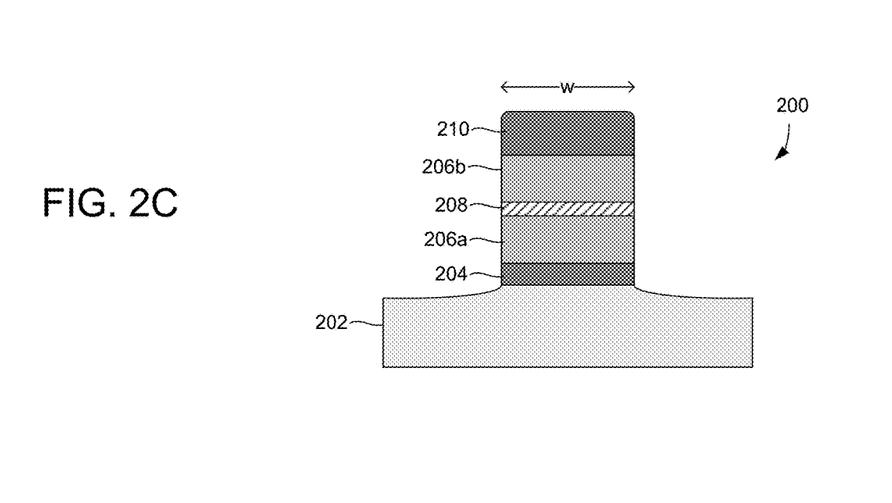

Certain difficulties may arise when using ion beam etching to form a spin-torque-transfer magnetic random access memory (STT-RAM, also referred to as STT-MRAM) device. One such difficulty is described in relation to FIGS. 2A-2D. FIGS. 2A-2C illustrate a partially fabricated semiconductor substrate 200 as it undergoes a multi-step etching process 250 described in FIG. 2D. FIG. 2A illustrates the substrate 200 before the etching process 250 begins. The substrate 200 includes a bottom electrode layer 202, an etch stop layer 204, a first magnetic layer 206a, a tunneling dielectric layer 208, a second magnetic layer 206b, and a patterned mask layer 210. These layers are used to form a magnetic tunneling junction (MTJ). The materials used to make each layer are generally known in the art. Example materials for the etch stop layer 204 and the mask layer 210 include, but are not limited to, tantalum and tantalum nitride. Example materials for the magnetic layers 206a and 206b include, but are not limited to, cobalt, iron, nickel, platinum, palladium, and combinations thereof. One commonly used material for the magnetic layers 206a and 206b is cobalt iron. This layer may also be doped with one or more materials, including but not limited to boron. One example material for the tunneling dielectric layer 208 is magnesium oxide, though other materials may be used in some cases. Example materials for the bottom electrode layer 202 include, but are not limited to, tungsten, tantalum, tantalum nitride, titanium, titanium nitride, aluminum, copper, etc.

Figure 2D:
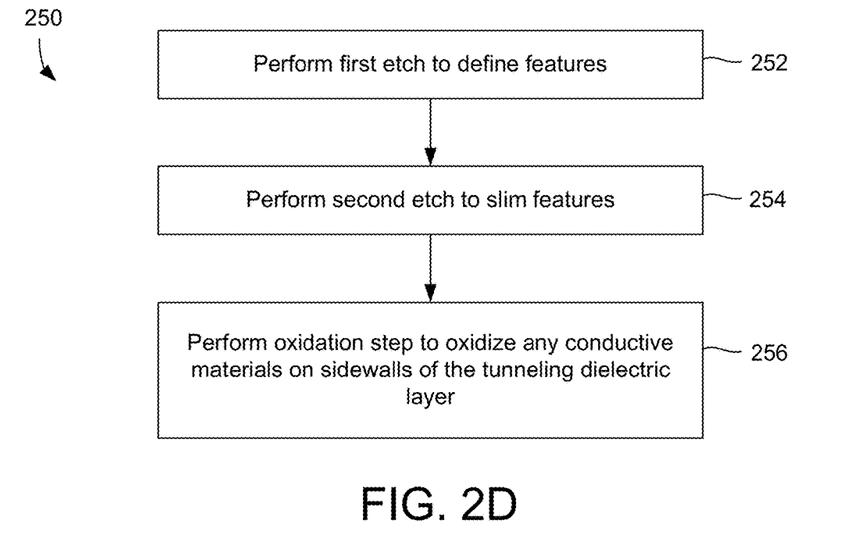
FIG. 2D is a flowchart describing a multi-step method for etching features in a substrate.

With reference to FIG. 2D, the multi-step etching process 250 begins at operation 252, where a first etching operation (often referred to as the main etch operation) is performed to define the features in the stack of materials on the substrate 200. In various embodiments, this operation may involve exposing the substrate to inert ion beams to physically sputter away the relevant materials, as desired. Alternatively or in addition, in some other embodiments, operation 252 may involve exposing the substrate to reactive chemistry to aid in the etching process. In such cases, the etching may occur through a chemical (rather than purely physical) mechanism. This operation is typically done at a relatively high ion energy, in some cases between about 100-10,000 eV (in some cases between about 100-1000 eV). In a particular example argon ions are used, at an ion energy of about 1000 eV. During this operation, the ions may impinge upon the substrate at a 90° angle, and the etching may occur downward through the stack of materials in an anisotropic manner. The first etch may have a duration between about 30-300 s, or between about 100-200 s.

FIG. 2B illustrates the substrate 200 after the first etch in operation 252. At this point, the features are defined in the substrate 200, but they are wider than desired. Next, operation 254 involves performing a second etch (often referred to as the trim etch operation) to narrow the features on the substrate 200. Like the first etch in operation 252, the second etch in operation 254 may involve exposing the substrate 200 to inert ion beams and/or reactive chemistry. The second etch is typically performed at a lower ion energy than the first etch. In various embodiments, the ion energy during the second etch may be between about 50-300 eV. In a particular example argon ions are used, at an ion energy of about 100 eV. The substrate 200 is typically tilted with respect to the direction of the ion beams such that the ion beams impinge upon the substrate 200 at a non-normal angle. In some embodiments, the transition between the first etch in operation 252 and the second etch in operation 254 involves temporarily ceasing the flux of ions onto the substrate 200 (e.g., by closing a shutter on the ion source and/or extinguishing the plasma, etc.), altering the position of the substrate 200 with respect to the ion source, and lowering the ion energy. FIG. 2C illustrates the substrate 200 after the second etch in operation 254. The width (w) of the feature after the second etch may be about 40 nm or lower. In some cases, the width of the feature after the second etch may be between about 20-40 nm. Prior to the second etch, this width is greater, in some cases between about 50-100 nm. The second etch may decrease the width of the feature by about 10-30%. Often, the feature will have an aspect ratio on the order of about 1:1 after the second etch. The features may have a pitch on the order of about 100 nm in some cases. In certain embodiments, the second etch may have a duration between about 60-600 s, or between about 100-300 s.

During the second etch in operation 254, ions impinge upon the sidewalls of the features at an angle. One consequence is that metal from the magnetic layers (particularly the second magnetic layer 206b) can be pushed into the tunneling dielectric layer 208. Further, material from the bottom electrode layer 202 and/or material from neighboring features may be sputtered up/over onto the sidewalls of the tunneling dielectric layer 208. These phenomena are undesirable because they introduce conductive material into/onto the tunneling dielectric layer 208, which should be an insulating material. This conductive material can cause a short to form across the tunneling dielectric layer 208, often resulting in failure of the finished device.

In order to combat the problem of conductive material in/on the tunneling dielectric layer 208, an oxidation step is performed in operation 256. The transition between the second etch in operation 254 and the oxidation step in operation 256 may be similar to the transition between operations 252 and 254. For instance, the transition may involve ceasing the flux of ions onto the substrate 200 (e.g., through use of a shutter, extinguishing the plasma, etc.), optionally altering the position of the substrate 200 with respect to the ion beams (e.g., tilting the substrate and/or causing the ion beams to alter their direction), and lowering the ion energy. The transition may also involve initiating delivery of a different process gas such that the ion beams in operation 256 have a different composition than the ion beams used in operation 254.

The oxidation step in operation 256 involves exposing the substrate 200 to relatively low energy ions to oxidize and thereby reduce the conductivity of conductive material on the sidewalls at the tunneling dielectric layer 208. In various embodiments, the ions that impinge upon the substrate 200 are generated from a process gas that includes a relatively small amount of oxygen in argon or another inert gas. In some such cases, the process gas used to generate the ion beams may be about 1-20% oxygen, by volume. In certain implementations, the oxygen exposure may be done periodically, for example between steps where only inert ions are delivered to the substrate. In some other implementations, the oxygen delivery may be continuous and the composition of the ion beams may be uniform over the course of the oxidation step. In still other embodiments, the oxygen may be delivered separately from the ion beams, for example in the form of $O_2$ delivered directly to the reaction chamber. Example ion energies for this step may be between about 10-100 eV. The duration of the oxidation step may be between about 30-300 s, or between about 60-120 s. In a particular example, operation 256 involves exposing the substrate 200 to oxygen ions and argon ions provided at an ion energy of about 50 eV, with an ion beam generated from a process gas that is 10% oxygen in argon by volume. By oxidizing the conductive materials on the sidewalls of the feature at the tunneling dielectric layer 208, the likelihood of forming a short across this layer is significantly reduced. After this oxidation step, the multi-step etch process is complete.

Unfortunately, oxygen atoms (as well as any other materials present in the chamber, e.g., hydrogen, nitrogen, moisture, etc.) can diffuse into the feature. As feature sizes continue to shrink, such diffusion becomes increasingly problematic. Under the same set of diffusion conditions, a narrower feature will be damaged to a greater degree than a wider feature (e.g., a greater proportion of the narrower feature will be damaged). Therefore, although the diffusion issue was not previously seen as particularly problematic, it is an issue that is gaining importance with shrinking feature sizes. At the feature sizes described herein (e.g., about 40 nm or less), such diffusion can be very damaging.

The diffused materials can cause significant damage to the device, particularly along the sensitive interfaces between the tunneling dielectric layer and the magnetic layers. The result is that there is a small processing window. On one hand, exposing the substrate to oxygen reduces the likelihood of forming shorts across the tunneling dielectric layer. On the other hand, exposing the substrate to oxygen increases the likelihood that oxygen atoms will form on the surface of the features and diffuse into the features to damage and potentially destroy the device. To strike a balance between these concerns, typically only a small amount of oxygen is provided to the substrate, though in some cases even such small amounts of oxygen can damage or destroy a device. Advantageously, the disclosed embodiments provide processing methods that expand the available processing window.

For example, various disclosed embodiments use a processing scheme that reduces the degree of diffusion within the feature, for example by using a substrate support (often referred to as a thermoelectric electrostatic chuck) that is cooled during particular processing steps. One result is that a higher amount of oxygen can be delivered to the substrate for a given tolerance of oxygen diffusion within the feature, meaning that any conductive material on the sidewalls of the feature at the tunneling dielectric layer can be more effectively oxidized and the risk of shorting across this layer can be minimized. Conversely, for a given amount of oxygen delivered to the substrate to oxidize conductive material on the sidewalls of the feature at the tunneling dielectric layer, there will be less diffusion-related damage to the resulting device.

Further, in certain embodiments the process flow described in FIG. 2D may be altered (1) to reduce the risk of forming conductive material on the sidewalls of the features at the tunneling dielectric layer, and/or (2) to reduce the risk of oxygen atoms forming on and diffusing into the feature. Such embodiments are further described below.

As mentioned, one way to combat the diffusion problem is to utilize a substrate support that can be cooled to low temperatures during certain processing steps. The cooled substrate support helps maintain the substrate at a relatively low temperature. Because diffusivity is temperature-dependent, the result is that diffusion can be minimized.

The diffusion coefficient refers to a proportionality constant between the molar flux due to molecular diffusion and the gradient in the concentration of the species. The higher the diffusion coefficient of a first substance with respect to a second substance, the faster the two substances will diffuse into one another. The dependence of the diffusion coefficient as a function of temperature follows the Arrhenius equation:

$$D=D_0*e^{(-Qd/kB*T)}$$

Where
D=diffusion coefficient at a particular temperature
$D_0$=temperature-independent pre-exponential
Qd=activation energy for diffusion
kB=Boltzmann constant, and
T=temperature Because the diffusion coefficient increases with increasing temperature, the diffusion of oxygen and other impurities into the features can be minimized by maintaining the substrate at a low temperature during certain processing steps. For example with reference to FIG. 2D, it may be particularly beneficial to maintain the substrate at a low temperature during the oxidation step in operation 256.

Figure 3A:
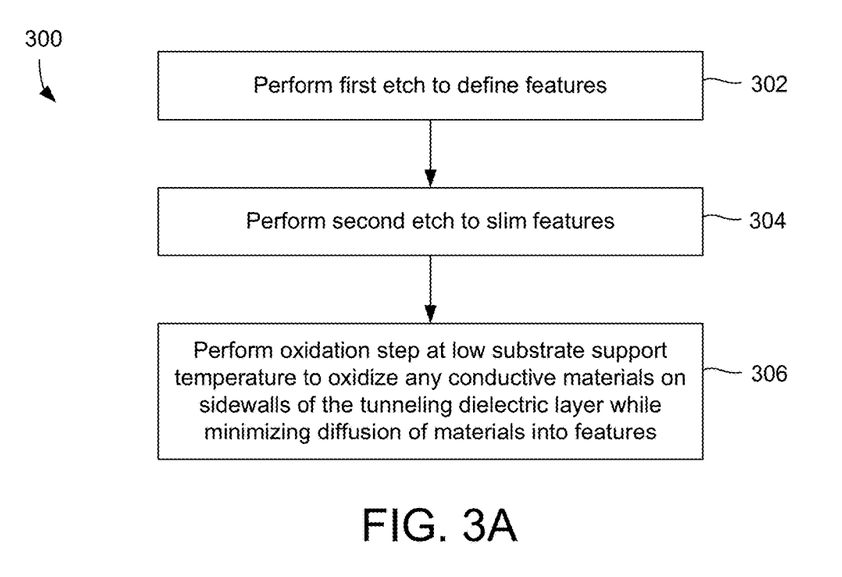
FIGS. 3A-3E are flowcharts describing various multi-step methods for etching features in a substrate according to different embodiments.

FIG. 3A presents a flow chart for a multi-step etch process for etching features on a semiconductor substrate according to certain embodiments. The substrate may include a stack of materials as shown in FIGS. 2A-2C, and FIG. 3A will be explained with reference to these figures. The method 300 begins at operation 302, where a first etch is performed to define the features on the substrate 200. The substrate 200 may be as shown in FIG. 2A before the first etch, and as shown in FIG. 2B after the first etch. The first etch in operation 302 may be as described in relation to operation 252 in FIG. 2D, and any details provided regarding operation 252 may also apply to the first etch in operation 302. In various embodiments, the substrate support may be maintained at a temperature between about 10-120° C., or between about 30-80° C., or between about 50-120° C., during the first etch.

In various cases, it may be desirable to maintain the substrate support (and therefore the substrate 200) at a relatively warm temperature during the first etch. While lower substrate temperatures are advantageous for reducing the diffusion coefficient, there is also a competing concern. Lower substrate/substrate support temperatures increase the likelihood that vapor phase materials (e.g., water, oxygen, hydrogen, nitrogen, etc.) within the chamber will condense on the features of the substrate. When such materials condense on the features, they have a greater opportunity to diffuse into the features. In addition, such condensed materials can interfere with the etching process. Therefore, the low temperature substrate support/substrate may only be used during particular steps, as described herein. Because the first etch is often performed with an inert ion beam (such that the concentration of oxygen that could undesirably diffuse into the features is quite low) and involves etching a significant amount of material, it is advantageous in many embodiments to practice the first etch at a relatively warm substrate temperature, as described above. In another embodiment, the first etch may be performed with a cooled substrate support. In such cases, the substrate support may be maintained at a temperature between about 10-120° C., or between about 10-80° C., or between about 10-50° C. during the first etch.

Next, at operation 304 a second etch is performed to narrow the features. The second etch in operation 304 may be as described in relation to operation 254 of FIG. 2D, and any details provided regarding operation 254 may also apply to the second etch in operation 304. Similarly, details presented above regarding the transition from operation 252 to 254 may also apply to the transition from operation 302 to 304. In certain embodiments, the substrate support may be maintained at a relatively warm temperature during the second etch, for example between about 10-120° C., or between about 30-80° C. Because this etch often involves delivery of inert ion beams (and the concentration of oxygen that could undesirably diffuse into the features is relatively low), it may be advantageous in various cases to perform the second etch at a relatively warm substrate/substrate support temperature. The concerns about low temperature are generally the same as those described in relation to the first etch in operation 302.

In another embodiment, the substrate support temperature may be actively lowered during the second etch in operation 304. Example starting temperatures for the substrate support for the second etch may be between about −30° C. and 120° C. (or any temperature range described herein with respect to the first etching operation). Example ending temperatures for substrate support for the second etch may be between about −70° C. and −10° C., and the rate of cooling may be between about 0.5-4° C./s, for example between about 1-3° C./s in some cases. In some embodiments, the low temperature issues (e.g., related to undesired condensation of materials on the features) are of greater concern during the first etch compared to the second etch. This may be because of the greater amount of material removed in the first etch and/or because of other process differences (e.g., ion energy, chemistry, etc.). As such, it is sometimes desirable for the substrate support temperature to be maintained relatively warm during the first etch, then decrease before and/or during the second etch. One advantage of decreasing the substrate support temperature during the second etch is that the substrate support will be at a low temperature at the start of the oxidation step in operation 306. As described below, it is often advantageous to perform the oxidation step at a low substrate support/substrate temperature. By ensuring that the substrate support/substrate are at a relatively low temperature at the end of the second etch, there is no need to wait for the substrate support/substrate to cool down between operations 304 and 306. Therefore, lowering the substrate support/substrate temperature during the second etch may improve throughput. A substrate support using thermoelectric elements can provide these operating temperature ranges, along with the ability to change temperature rapidly (greater than or equal to 1 degree Celsius per second).

Next, at operation 306, an oxidation step is performed. This oxidation step may be as described in relation to operation 256 in FIG. 2D, and any details provided in relation to operation 256 may also apply to operation 306. Similarly, any details provided regarding the transition between operations 254 and 256 may also apply to the transition between operations 304 and 306. However, in some cases a relatively longer pause may be used between operations 304 and 306 to allow the substrate support to cool to a desired temperature. The substrate support may be maintained at a relatively low temperature during the oxidation step to minimize the degree to which materials (e.g., oxygen, moisture, etc.) diffuse into the features. The low substrate support temperature therefore protects the features, particularly the sensitive interfaces between the magnetic layers 206a and 206b and the tunneling dielectric layer 208. The result is that the oxygen (and/or other species) present in the chamber is much less likely to damage or destroy the resulting device.

Example temperatures for the substrate support during the oxidation step may be between about −70° C. and 10° C., or between about −30° C. and −10° C. In some embodiments, the temperature of the substrate support may decrease during the oxidation step (e.g., the substrate support may begin or continue to be actively cooled during operation 306). Example rates of cooling between operations 304 and 306, and/or during operation 306, may be within the ranges of cooling rates discussed above. The method 300 of FIG. 3A differs from the method 250 of FIG. 2D at least in terms of controlling the temperature of the substrate support to minimize diffusion of oxygen or other materials into the features.

In certain implementations, diffusion into the features on the substrate can be further minimized by departing from the process flow described in FIG. 3A. Such process flow changes may relate to (1) replacement of the oxidation step in operation 306 with a process that does not involve delivery of oxygen to the substrate, and/or (2) preferential deposition of material during the second etch in operation 304 such that material which is backsputtered onto the feature sidewalls is non-conductive, and/or (3) elimination of the oxidation step.

Figure 3B:
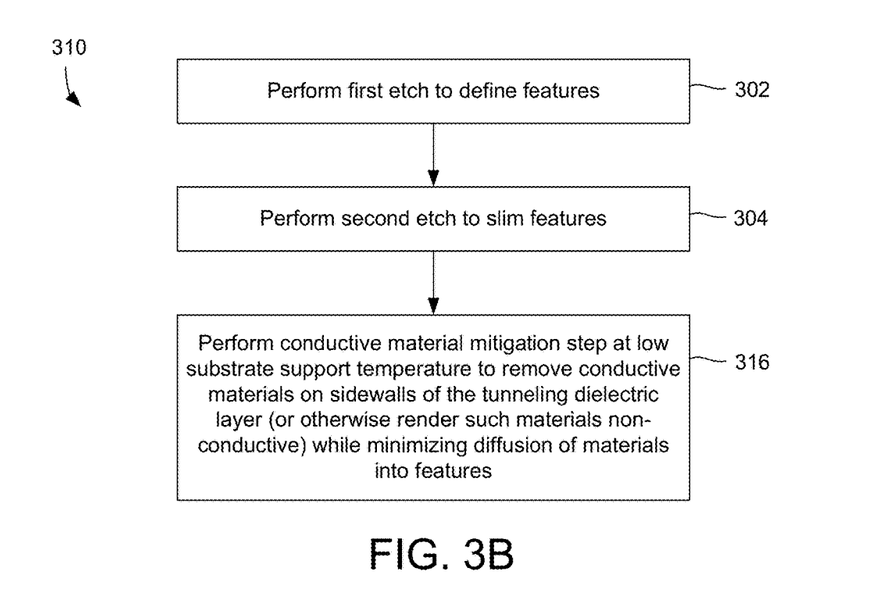

FIG. 3B presents a flow chart for a multi-step etch process for etching features on a semiconductor substrate according to certain embodiments in which the oxidation step 306 is replaced with a conductive material mitigation step 316. This embodiment also utilizes a cooled substrate support to cool the substrate and minimize diffusion of materials into the features. The method 310 begins at operations 302 and 304 with the first and second etches, respectively. These operations are described above, and for the sake of brevity the description will not be repeated. The method 310 continues at operation 316, where a conductive material mitigation step is performed. This step may be performed without exposing the substrate to oxygen. Instead, the substrate may be exposed to inert ion beams and/or an alternative chemistry to remove the conductive material on sidewalls of the tunneling dielectric layer, or to otherwise render such materials non-conductive.

The use of inert ion beams, without oxygen, will substantially reduce the risk that oxygen will diffuse into the features to a destructive degree. The use of an alternative chemistry may similarly reduce the risk that oxygen will diffuse into the features to a destructive degree. Such alternative chemistry may have a lower diffusion coefficient with respect to the material of the tunneling dielectric layer in comparison to oxygen, meaning that any diffusion into the features is likely to be less extensive. Similarly, the alternative chemistry may result in less damage to the device, even at similar diffusion levels, depending on the chemistry chosen. In one implementation, operation 316 involves exposing the substrate to inert ion beams, without exposing the substrate to any reactive chemistry. Any conductive material on the sidewalls of the tunneling dielectric layer 208 may be physically sputtered away by the inert ion beams. In some other examples, the substrate may also be exposed to reactive chemistry. The reactive chemistry may be delivered directly to the substrate surface (e.g., without passing through the ion source from which the ion beams are generated), or it may be delivered as part of the process gas used to generate the ion beams.

Example reactive chemistries that may be delivered to remove (or otherwise render non-conductive) any conductive materials present on sidewalls of the features at the tunneling dielectric layer 208 include, but are not limited to, $O_2$, CO, $CO_2$, $N_2$, and combinations thereof. Example ion energies during operation 316 may be between about 10-100 eV, or between about 20-80 eV. Example durations for operation 316 may be between about 30-600 s, or between about 200-300 s. Example temperatures for the substrate support during operation 316 may be between about −70° C. and 10° C., or between about −30° C. and −10° C. The low temperature substrate support may help minimize the degree to which materials (e.g., any hydrogen, oxygen, nitrogen, moisture, etc. present in the chamber) are able to diffuse into the features. For the reasons discussed above, it may be beneficial to perform the first and second etches in operations 302 and 304, respectively, at relatively higher substrate support temperatures. In some cases, the substrate support temperature may be actively lowered during the second etch, as mentioned above.

Figure 3C:
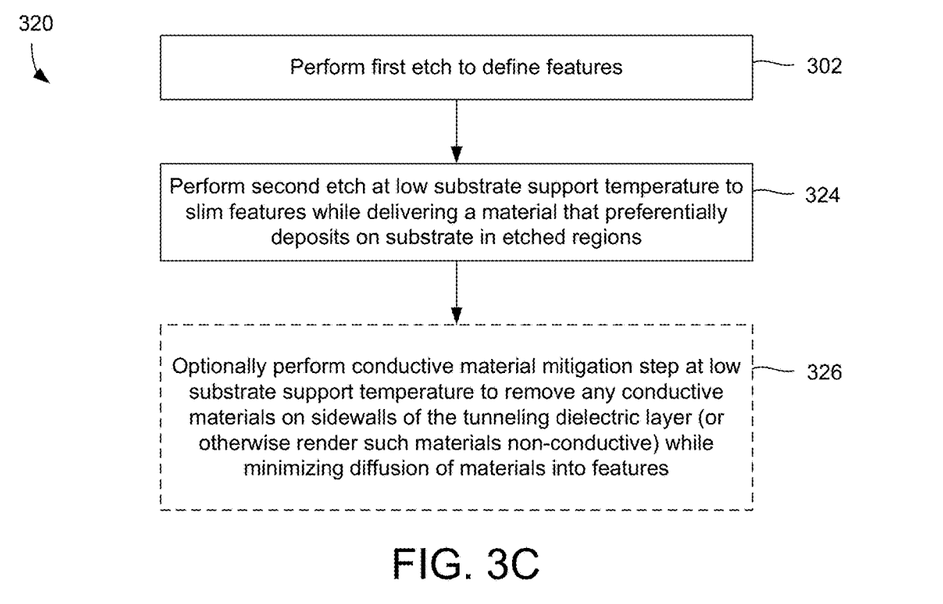

FIG. 3C presents a flowchart for a multi-step etch process for etching features on a semiconductor substrate according to certain embodiments in which a material is preferentially deposited on certain portions of the substrate. This material minimizes the degree to which conductive material backsputter onto features on the substrate. As a result, less conductive material forms on sidewalls of the features at the tunneling dielectric layer, and the likelihood of forming a short across this layer is significantly reduced.

The method 320 begins at operation 302, where the first etch is performed. This etch may be similar to the first etch in operation 302 of FIG. 3A, and for the sake of brevity the description will not be repeated. The method 320 continues at operation 324 where a second etch is performed. This etch may be done at a relatively low substrate support/substrate temperature to minimize the degree to which species present in the chamber are able to diffuse into the features. In some cases, the substrate support may be maintained at a temperature between about −70° C. and 10° C., or between about −30° C. and −10° C. during operation 324. During the second etch, a vapor phase material is delivered to the substrate and allowed to preferentially deposit in the etched regions. With reference to FIG. 2B, the material may preferentially deposit on the bottom electrode layer 202, as compared to the feature defined in the remaining layers 204, 206a, 208, 206b, and 210. Such preferential deposition can be achieved due to the temperature differential between the etched region/bottom electrode layer 202 and the feature formed above the bottom electrode layer 202. For example, the bottom electrode layer 202 remains cooler than the feature formed above this layer due to (1) the cooled substrate support, and (2) ions impinging on sidewalls of the feature, which cause the feature to heat up.

In various embodiments, the material chosen for the preferential deposition is one that (1) is non-conductive and/or (2) forms a non-conductive material when combined with (a) the material of the bottom electrode layer 202, (b) the material of the first magnetic layer 206a, and/or (c) the material of the second magnetic layer 206b. In this way, any material that backsputters from the bottom electrode layer 202, and/or from magnetic layers 206a/206b in adjacent features will be significantly less problematic than the conductive material that would backsputter in the absence of the deposited material. The result is that the risk of forming a short across the tunneling dielectric layer 208 is significantly reduced.

Example materials that may be preferentially deposited include, but are not limited to, carbon, $SiO_2$, SiN, SiC, SiCO, SiCN, and combinations thereof. Example reactants that may be used to form such materials include, but are not limited to, $CH_4$, $O_2$, $CO_2$, CO, $N_2$, $H_2S$, $SiH_4$, and combinations thereof. The reactant used to form the preferentially deposited material may be delivered as a part of the source gas used to generate the ion beams, or it may be delivered directly to the reaction chamber/substrate without ever forming a plasma from the reactant. The reactant may be provided in an inert carrier gas. Where the reactant is delivered as part of the source gas used to generate the ion beams, the source gas may include the reactant at a concentration between about 0.5-10% by volume.

In certain embodiments, the method 320 may be complete after operation 324. Because relatively little or no conductive material forms on the sidewalls of the features at the tunneling dielectric layer 208 during operation 324 and/or because operation 324 results in formation of non-conductive material on the sidewalls of the features at the tunneling dielectric layer 208, there may be no need to oxidize, remove, or otherwise mitigate such conductive material after operation 324. In some cases, however, the method 320 may continue with operation 326. Here, a conductive material mitigation step may be optionally performed. Operation 326 is similar to operation 316 of FIG. 3B, and any details provided in relation to operation 316 may also apply to operation 326.

Figure 3D:
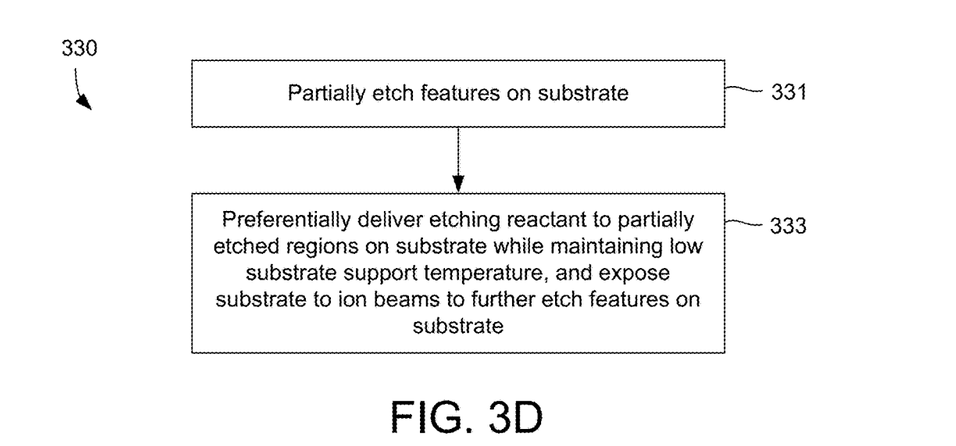

FIGS. 3D and 3E present flowcharts for methods of etching a feature using a reactive ion beam etching mechanism that utilizes preferential deposition of reactive chemistry. With reference to FIG. 3D, the method 330 begins at operation 331 where a feature is partially etched in a substrate. Any etching method may be used, including but not limited to any of the etching methods described herein. At operation 333, an etching reactant is delivered to the substrate and allowed to preferentially deposit on the partially etched regions of the substrate, similar to the preferential deposition described in relation to operation 324 of FIG. 3C. The preferential deposition may be enabled due to the temperature differential between the partially etched features (which may be relatively warmer due to ion bombardment) and the underlying materials (which may remain relatively cooler due to the cooled substrate and lack of ion bombardment). This temperature differential may allow the etching reactant to concentrate at the bottom of the partially etched features, where such etchant is most desired/useful. Example chemistries that may be used include, but are not limited to, halide-containing compounds, metalorganic compounds, etc.

In one embodiment, operation 333 begins after operation 331 is complete. In another embodiment, operations 331 and 333 overlap in time. The etching in operation 331 may be done in a continuous or periodic manner. Similarly, the reactant delivery and/or ion beam exposure in operation 333 may be done in a continuous or periodic manner.

Figure 3E:
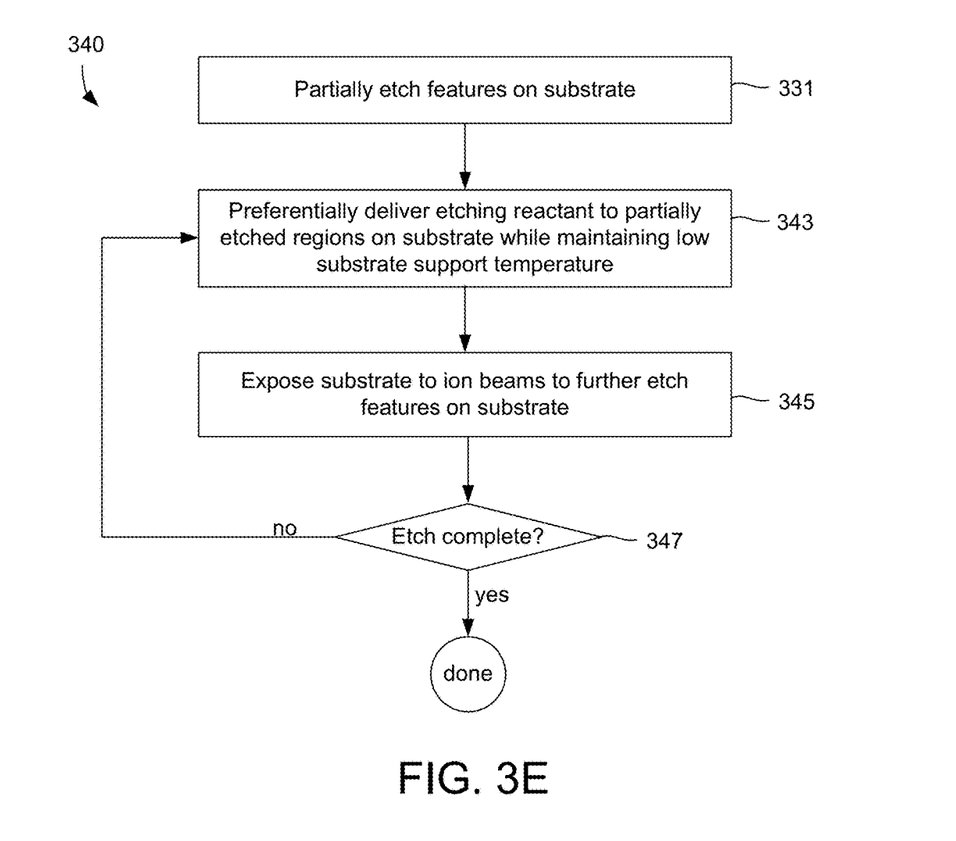

FIG. 3E presents a particular embodiment of the method 330 presented in FIG. 3D. The method 340 of FIG. 3E begins at operation 331, where a feature is partially etched on a substrate. Like operation 331 of FIG. 3D, this etching operation may be any appropriate etching operation, including any of the etching operations described herein. In one example, the etch in operation 331 is performed as described in relation to the first etch in operation 302 in FIG. 3A. In some such embodiments, the etch in operation 331 differs from the first etch described in operation 302 of FIG. 3A in that the etch in operation 331 is less extensive (as the feature is only partially etched in operation 331). At operation 343, an etching reactant is preferentially delivered to partially etched regions on the substrate (e.g., between the partially etched features, at the etch front). The preferential reactant delivery may be enabled as a result of the cooled substrate support.

With reference to the substrate 200 shown in FIG. 2A, operation 331 may involve, in one example, etching through the second magnetic layer 206b. The result is a partially etched feature formed of layers 206b and 210, with the underlying tunneling dielectric layer 208 exposed between adjacent partially etched features. Operation 343 may then involve delivering an etching reactant to the substrate, which preferentially deposits on the exposed regions of the tunneling dielectric layer 208 due to the cooler temperature of this layer compared to the partially etched feature (which at this point is made of the second magnetic layer 206b and the mask layer 210).

The method 340 continues at operation 345, where the substrate is exposed to ion beams to further etch the features on the substrate. Because the etching reactant is preferentially deposited in regions where further etching is desired, this etch process may be particularly beneficial for achieving fast, high quality, anisotropic etching results. At operation 347 it is determined whether the etch process is complete. If so, the method 340 is done and the substrate may be removed for further processing. In cases where the feature is not yet fully etched at operation 347, the method 340 may return to operation 343 where additional etching reactant is delivered to the substrate and allowed to preferentially deposit as described above. The reactant delivery in operation 343 and ion beam exposure in operation 345 may be repeated until the feature is fully etched. Operations 343 and 345 may or may not overlap in time. Operation 343 may begin during or after operation 331.

One advantage of the methods of FIGS. 3D and 3E is that the etching reactant is concentrated in regions where it is most desired/useful. This feature may allow an etching process to occur using relatively less etching reactant while achieving the same degree of etching. Further, this feature may reduce the degree to which the reaction chamber becomes damaged as a result of exposure to a harsh etching reactant (since relatively less etching reactant is used, and the etching reactant that is used becomes concentrated on the cooled substrate rather than the warmer chamber surfaces).

In any of the embodiments described herein, the surfaces of the reaction chamber (e.g., chamber walls, showerhead, electrodes, ceiling, etc.) other than the substrate support may be heated. The substrate support itself may also be capable of heating in many cases. The use of heated chamber surfaces may be particularly advantageous when practicing the methods in FIGS. 3C-3E, which take advantage of temperature differentials within the reaction chamber.

Further, in any of the embodiments described herein, the temperature of the substrate support may be cycled between a higher temperature and a lower temperature. Such temperature cycling may occur during a particular operation, for example any of the operations described in relation to FIGS. 2D and 3A-3E. In these or other cases, the temperature cycling may occur between two operations. For example, the temperature may be cycled between any two operations described in relation to FIGS. 2D and 3A-3E. A higher temperature may be one that is sufficient to drive off any condensed reactants from the substrate, and may be between about 25° C. and 120° C., or between about 50° C. and 110° C., depending on the reactants present. A lower temperature may be one that is sufficiently low to substantially prevent diffusion of species into the materials/structures on the substrate, and may be between about −70° C. and −10° C., or between about −50° C. and −20° C., depending on the reactants/materials present. A temperature difference between the lower temperature and higher temperature may be at least about 30° C., at least about 50° C., or at least about 70° C.

After the etch process is complete, the substrate may be heated before it is removed from the reaction chamber. Such heating may be performed after any of the methods in FIGS. 3A-3E. Such heating may occur via heating the substrate support. Example heating rates may be the same or faster than the cooling rates discussed above. One advantage of heating the substrate before it is removed from the reaction chamber is that it lowers the risk of forming ice, moisture, and other condensed materials on the substrate/features when the substrate is exposed to a different processing environment/atmosphere. Any such condensed materials can complicate (or even cause failure of) a future processing operation, and can also lead to damage in a final device.

Apparatus

The methods described herein may be performed by any suitable apparatus. A suitable apparatus includes hardware for accomplishing the process operations and a system controller having instructions for controlling process operations in accordance with the present embodiments. For example, in some embodiments, the hardware may include one or more process stations included in a process tool. One appropriate apparatus is described above in relation to FIG. 1.

Figure 4:
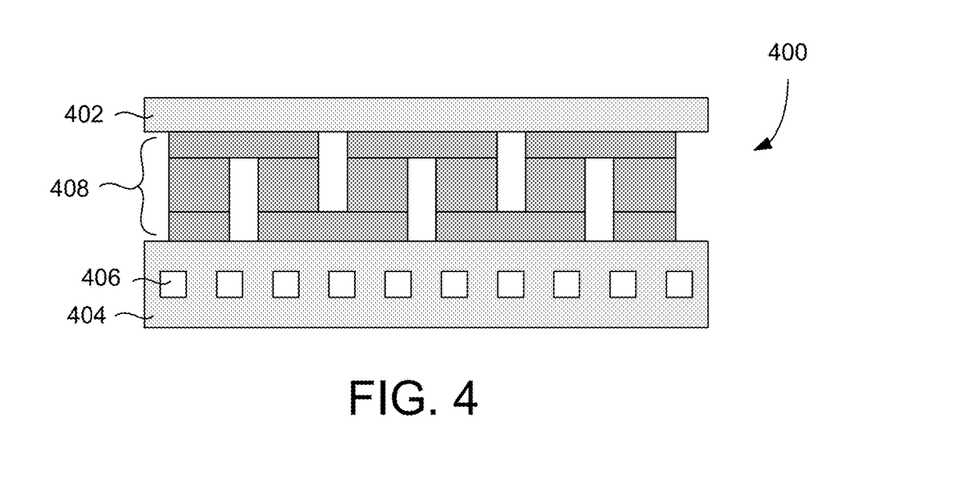
FIG. 4 shows a simplified cross sectional view of a portion of a substrate support that includes a series of Peltier devices that may be used to cool a substrate during an etching process.

FIG. 4 provides a simplified cross-sectional view of a portion of a substrate support 400. The substrate support 400 includes at least an upper plate 402 and a lower plate 404 separated by and in contact with a series of Peltier devices 408. The substrate (not shown) rests on the upper plate 402. Cooling channels 406 may be provided in the lower plate 404. The Peltier devices 408 operate to transfer heat from the upper plate 402 to the lower plate 404, where the heat is removed. In certain cases, the Peltier devices 408 may be used to transfer heat in the opposite direction, for example when it the substrate is actively heated. Additional details related to temperature controlled substrate supports are provided in U.S. patent application Ser. No. 13/908,676, incorporated by reference above. An alternate substrate support design (not shown) would consist of an upper plate 402 in contact with a lower plate 404, with cooling channels 406 in the lower plate to accommodate the circulation of refrigerant at cryogenic temperatures consistent with the claims herein. One example of a commercially available circulation unit is the Polycold Cryochiller model "MaxCool 2500" manufactured by Brooks Automation of Chelmsford, Mass. Heating the substrate, in order to avoid condensation or for other reasons discussed herein, may be accomplished by entering a mode that can elevate the support temperature over a time duration that would not prohibit its use based on excessive processing time.

System Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling, in some cases via the substrate support), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of etching a substrate for forming a spin-torque-transfer random access memory (STT-RAM) device, the method comprising:
   receiving the substrate in a reaction chamber, the substrate comprising (i) a bottom electrode layer, (ii) an etch stop layer positioned over the bottom electrode layer, (iii) a first magnetic layer positioned over the etch stop layer, (iv) a tunneling dielectric layer positioned over the first magnetic layer, (v) a second magnetic layer positioned over the tunneling dielectric layer, and (vi) a patterned mask layer;
   performing a first ion beam etching operation to define features on the substrate,
      the first ion beam etching operation comprising exposing the substrate to ion beams to etch through at least the second magnetic layer, the tunneling dielectric layer, and the first magnetic layer, and
      wherein during the first ion beam etching operation, a substrate support is maintained at a temperature between about 10° C. and about 120° C.;
   performing a second ion beam etching operation to narrow the features on the substrate,
      the second ion beam etching operation comprising exposing sidewalls of the features to ion beams,
      wherein the second ion beam etching operation is performed at a lower ion energy than the first ion beam etching operation, and
      wherein the first and/or second ion beam etching operation result in formation of conductive material on exposed portions of the tunneling dielectric layer and/or in the tunneling dielectric layer; and
   performing a conductive material mitigation operation to mitigate the conductive material formed on or in the tunneling dielectric layer during the first and/or second ion beam etching operation,
      wherein mitigating the conductive material comprises either removing the conductive material or rendering the conductive material less conductive,
      wherein the conductive material mitigation operation comprises exposing the substrate to ion beams,
      wherein the conductive material mitigation operation is performed at a lower ion energy than the second ion beam etching operation, and
      wherein during the conductive material mitigation operation, the substrate support is maintained at a temperature between about −70° C. and about −10° C.

2. The method of claim 1, wherein during the second ion beam etching operation, the substrate support temperature is lowered by at least about 20° C.

3. The method of claim 1, wherein during the second ion beam etching operation, the substrate support is maintained at a temperature between about 10° C. and about 120° C.

4. The method of claim 1, wherein during the conductive material mitigation operation, the ion beams comprise oxygen ions and inert ions.

5. The method of claim 1, wherein during the conductive material mitigation operation, the ion beams comprise inert ions without reactive ions.

6. The method of claim 1, wherein during the conductive material mitigation operation, the ion beams comprise inert ions and one or more reactant selected from the group consisting of: $O_2$, CO, $CO_2$, $N_2$, and combinations thereof.

7. The method of claim 1, wherein the ion energy during the first ion beam etching operation is between about 100-10,000 eV, wherein the ion energy during the second ion beam etching operation is between about 50-300 eV, and wherein the ion energy during the conductive material mitigation operation is between about 10-100 eV.

8. The method of claim 1, further comprising after the first ion beam etching operation and before the second ion beam etching operation, altering a relative orientation between the substrate and a direction in which the ion beams travel.

9. A method of etching a substrate for forming a spin-torque-transfer random access memory (STT-RAM) device, the method comprising:
   receiving the substrate in a reaction chamber, the substrate comprising (i) a bottom electrode layer, (ii) an etch stop layer positioned over the bottom electrode layer, (iii) a first magnetic layer positioned over the etch stop layer, (iv) a tunneling dielectric layer positioned over the first magnetic layer, (v) a second magnetic layer positioned over the tunneling dielectric layer, and (vi) a patterned mask layer;
   performing a first ion beam etching operation to define features on the substrate,
      the first ion beam etching operation comprising exposing the substrate to ion beams to etch through at least the second magnetic layer, the tunneling dielectric layer, and the first magnetic layer, and
      wherein during the first ion beam etching operation, a substrate support is maintained at a temperature between about 10° C. and about 120° C.;
   performing a second ion beam etching operation to narrow the features on the substrate,
      the second ion beam etching operation comprising exposing sidewalls of the features to ion beams and preferentially depositing a first material in regions etched during the first ion beam etching operation, and
      wherein during the second ion beam etching operation, the substrate support is maintained at a temperature between about −70° C. and about 10° C.

10. The method of claim 9, wherein (a) the first material is non-conductive, and/or (b) the first material, when combined with (i) a material of the bottom electrode layer, and/or (ii) a material of the first or second magnetic layer, is non-conductive.

11. The method of claim 10, wherein the first material comprises one or more materials selected from the group consisting of: carbon, $SiO_2$, SiN, SiC, SiCO, SiCN, and combinations thereof.

12. The method of claim 10, further comprising during the second ion beam etching operation, sputtering the first material onto the sidewalls of the features.

13. The method of claim 9, wherein the first material is an etching reactant.

14. The method of claim 13, wherein during the second ion beam etching operation, the sidewalls of the features are exposed to the ion beams while the first material is deposited in the regions etched during the first ion beam etching operation.

15. The method of claim 13, wherein the second ion beam etching operation comprises cyclically (a) depositing the first material and (b) exposing the substrate to the ion beams, wherein (a) and (b) do not overlap in time.

16. The method of claim 13, wherein the etching reactant comprises a halide-containing compound and/or metalorganic compound.

17. The method of claim 9, further comprising after the first ion beam etching operation, altering a relative orientation between the substrate and a direction in which the ion beams travel.

18. The method of claim 17, wherein altering the relative orientation between the substrate and the direction in which the ion beams travel comprises tilting the substrate.

* * * * *